United States Patent
Mitani et al.

(10) Patent No.: US 9,159,846 B2
(45) Date of Patent: Oct. 13, 2015

(54) SIC SEMICONDUCTOR DEVICE

(75) Inventors: Shuhei Mitani, Kyoto (JP); Masatoshi Aketa, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 313 days.

(21) Appl. No.: 13/314,268

(22) Filed: Dec. 8, 2011

(65) Prior Publication Data
US 2012/0146055 A1 Jun. 14, 2012

(30) Foreign Application Priority Data
Dec. 8, 2010 (JP) ................................. 2010-273837

(51) Int. Cl.
H01L 29/872 (2006.01)
H01L 29/06 (2006.01)
H01L 29/16 (2006.01)

(52) U.S. Cl.
CPC .......... *H01L 29/872* (2013.01); *H01L 29/0619* (2013.01); *H01L 29/0692* (2013.01); *H01L 29/1608* (2013.01); *H01L 2224/04042* (2013.01); *H01L 2224/05567* (2013.01); *H01L 2924/00014* (2013.01); *H01L 2924/12032* (2013.01)

(58) Field of Classification Search
CPC .................................................... H01L 29/872
USPC .................... 257/77, E29.242, E29.084, 473, 257/E29.264, E21.641
See application file for complete search history.

(56) References Cited

U.S. PATENT DOCUMENTS

| | | | | |
|---|---|---|---|---|
| 6,566,726 B1* | 5/2003 | Onose et al. | .................. | 257/490 |
| 7,763,504 B2* | 7/2010 | Kumar et al. | ................. | 438/173 |
| 7,915,705 B2* | 3/2011 | Yamamoto et al. | ........... | 257/496 |
| 7,964,911 B2* | 6/2011 | Kitabatake et al. | ........... | 257/328 |
| 2003/0096464 A1* | 5/2003 | Lanois | ........................... | 438/173 |
| 2005/0045892 A1* | 3/2005 | Hayashi et al. | .................. | 257/77 |
| 2006/0027833 A1* | 2/2006 | Tanimoto | ....................... | 257/173 |
| 2006/0255423 A1* | 11/2006 | Ryu et al. | ....................... | 257/485 |
| 2007/0090481 A1* | 4/2007 | Richieri | ......................... | 257/473 |
| 2007/0293001 A1* | 12/2007 | Wu | ................................ | 438/197 |
| 2008/0206941 A1* | 8/2008 | Okuno et al. | .................. | 438/198 |
| 2009/0008651 A1* | 1/2009 | Okuno et al. | .................... | 257/77 |
| 2010/0055882 A1* | 3/2010 | Imhoff et al. | ................. | 438/481 |
| 2010/0136760 A1* | 6/2010 | Yoshie | .......................... | 438/285 |
| 2011/0079792 A1* | 4/2011 | Lostetter et al. | ................ | 257/77 |
| 2011/0215338 A1* | 9/2011 | Zhang | ............................. | 257/73 |
| 2011/0220917 A1* | 9/2011 | Hayashi et al. | .................. | 257/77 |
| 2011/0284874 A1* | 11/2011 | Miura et al. | .................... | 257/77 |
| 2012/0228636 A1* | 9/2012 | Maeyama et al. | ................ | 257/77 |

FOREIGN PATENT DOCUMENTS

JP 2008-053418 A 3/2008

*Primary Examiner* — Yu-Hsi D Sun
*Assistant Examiner* — Ankush Singal
(74) *Attorney, Agent, or Firm* — Rabin & Berdo, P.C.

* cited by examiner

(57) ABSTRACT

A SiC semiconductor device includes a SiC semiconductor layer having a first-conductivity-type impurity, a field insulation film formed on a front surface of the SiC semiconductor layer and provided with an opening for exposing therethrough the front surface of the SiC semiconductor layer, an electrode connected to the SiC semiconductor layer through the opening of the field insulation film, and a guard ring having a second-conductivity-type impurity and being formed in a surface layer portion of the SiC semiconductor layer to make contact with a terminal end portion of the electrode connected to the SiC semiconductor layer. A second-conductivity-type impurity concentration in a surface layer portion of the guard ring making contact with the electrode is smaller than a first-conductivity-type impurity concentration in the SiC semiconductor layer.

7 Claims, 12 Drawing Sheets

FIG. 9
(EXAMPLE 2)
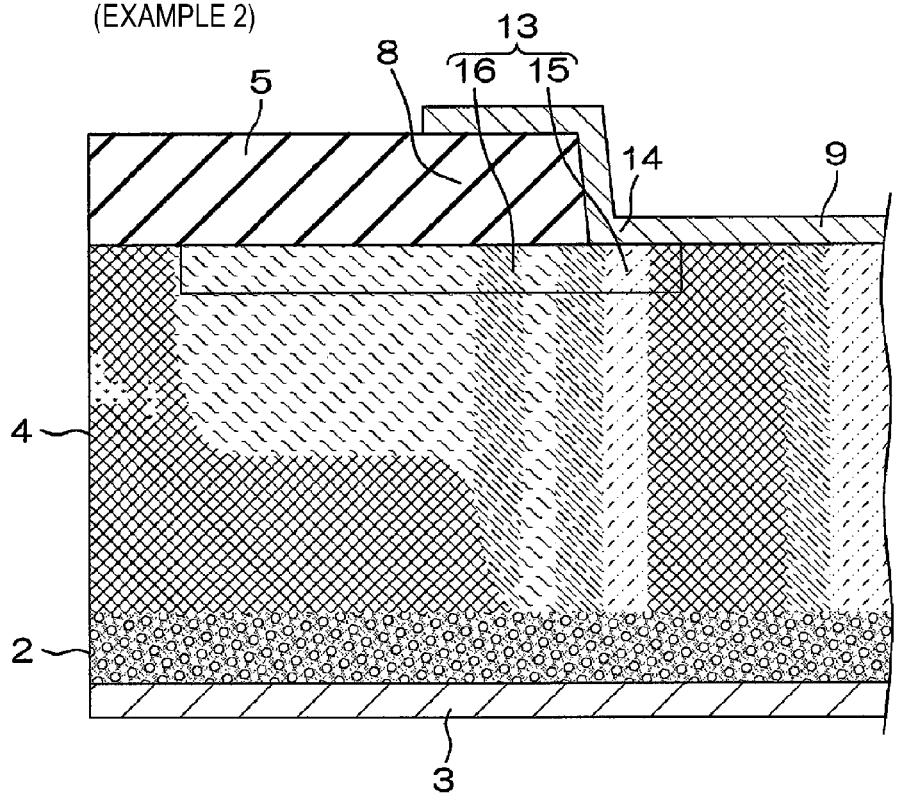
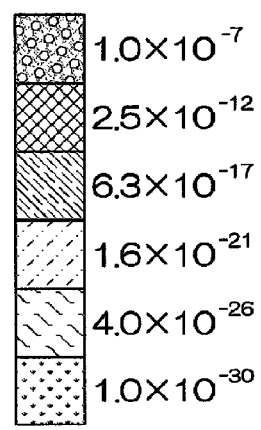
| | |
|---|---|
| | $1.0 \times 10^{-7}$ |
| | $2.5 \times 10^{-12}$ |
| | $6.3 \times 10^{-17}$ |
| | $1.6 \times 10^{-21}$ |
| | $4.0 \times 10^{-26}$ |
| | $1.0 \times 10^{-30}$ |

FIG. 11
(COMPARATIVE EXAMPLE 1)
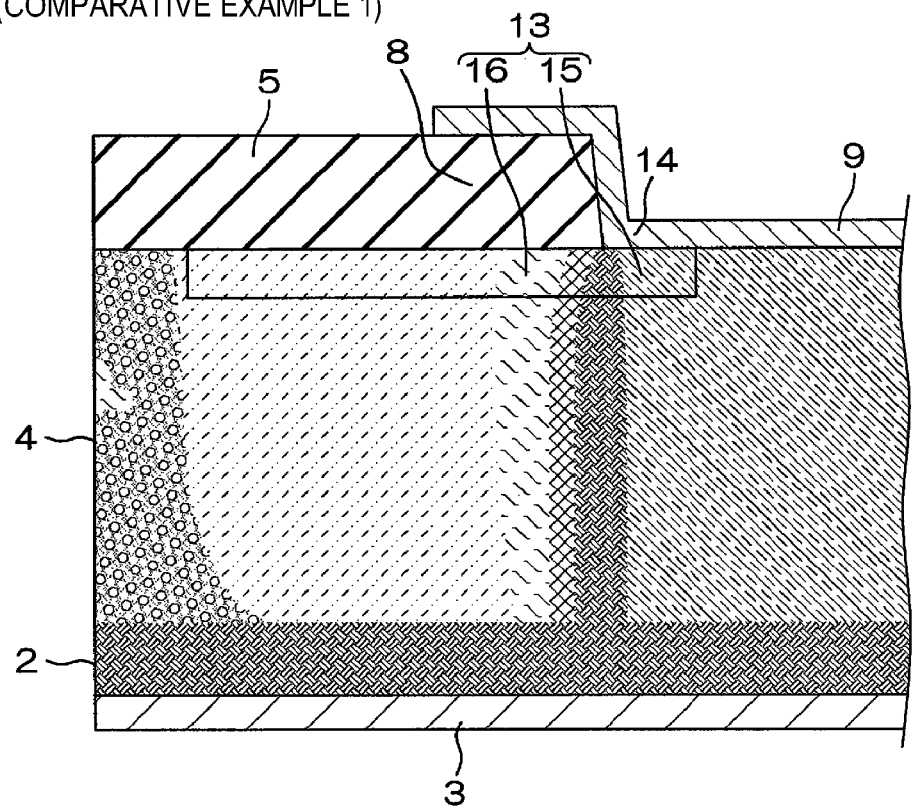
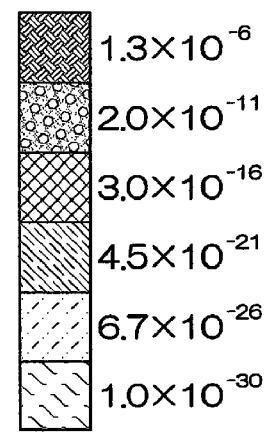

SIC SEMICONDUCTOR DEVICE

CROSS-REFERENCE TO RELATED APPLICATION

This application is based upon and claims the benefit of priority from Japanese Patent Application No. 2010-273837, filed on Dec. 8, 2010, the entire contents of which are incorporated herein by reference.

TECHNICAL FIELD

The present disclosure relates to a SiC semiconductor device.

BACKGROUND

There is interest in a SiC (silicon carbide) semiconductor capable of realizing a higher breakdown voltage, higher current flow and lower on-resistance in comparison with a Si semiconductor. Various kinds of power devices (e.g., diodes and MISFETs) employing the SiC semiconductor are primarily used in systems in the field of power electronics, such as a motor control system and a power conversion system.

Even if a SiC power device has a high breakdown voltage, in some instances the SiC power device suffers from dielectric breakdown when in use. In view of this, different kinds of breakdown voltage measures have been proposed in recent years. For example, in a SiC-Schottky barrier diode including an n-type SiC semiconductor layer and a Schottky electrode Schottky-connected to the SiC semiconductor layer, there is proposed a structure in which a p-type guard ring is formed in the SiC semiconductor layer to make contact with a terminal end portion of the Schottky electrode (see, e.g., JP2008-53418A). In this structure, a depletion layer generated by a p-n junction is broadened near the terminal end portion of the Schottky electrode, thereby alleviating field concentration on the terminal end portion of the Schottky electrode.

Despite the breakdown voltage measure taken by the structure disclosed in JP2008-53418A, there still remains a problem in that current concentration on the terminal end portion of the Schottky electrode may occur at the time of an avalanche breakdown of the device, which leads to the destruction of the device.

SUMMARY

The present disclosure provides a SiC semiconductor device capable of alleviating current concentration at the time of avalanche breakdown and that enhances both breakdown voltage and anti-avalanche capacity.

According to one embodiment of the present disclosure, there is provided a SiC semiconductor device, including: a SiC semiconductor layer having a first-conductivity-type impurity; a field insulation film formed on a front surface of the SiC semiconductor layer and provided with an opening for exposing therethrough the front surface of the SiC semiconductor layer; an electrode connected to the SiC semiconductor layer through the opening of the field insulation film; and a guard ring having a second-conductivity-type impurity and being formed in a surface layer portion of the SiC semiconductor layer to make contact with a terminal end portion of the electrode connected to the SiC semiconductor layer. A second-conductivity-type impurity concentration in a surface layer portion of the guard ring making contact with the electrode is smaller than a first-conductivity-type impurity concentration.

With this configuration, the electrode is connected to the SiC semiconductor layer through the opening of the field insulation film. The second-conductivity-type guard ring is formed in the surface layer portion of the SiC semiconductor layer and configured to make contact with the terminal end portion of the electrode (an outer edge portion of the electrode within the opening) connected to the SiC semiconductor layer. The second-conductivity-type impurity concentration in the surface layer portion of the guard ring making contact with the electrode has a smaller impurity concentration than the first-conductivity-type impurity concentration. In other words, the second-conductivity-type impurity concentration is smaller than the first-conductivity-type impurity concentration in the surface layer portion of the guard ring. The surface layer portion shows a first-conductivity-type property rather than a second-conductivity-type property.

Accordingly, when an electric current flows through the SiC semiconductor layer, it is possible to disperse a current density within the SiC semiconductor layer or to shift a portion having a relatively high current density to an inner position from the terminal end portion of the electrode while dispersing the current density. As a consequence, even with the occurrence of an avalanche breakdown, it is possible to reduce the density of an electric current flowing toward the terminal end portion of the electrode. This makes it possible to prevent a device from being destroyed by avalanche breakdown.

Further, a depletion layer is broadened near the terminal end portion of the electrode by a p-n junction of the SiC semiconductor layer and the guard ring, and the depletion layer restrains an electric field from concentrating on the terminal end portion of the electrode. This assists in enhancing the breakdown voltage of a device.

In the SiC semiconductor device, the guard ring may have a depth of 2,000 Å or more. In this case, the second-conductivity-type impurity concentration in a portion of the guard ring extending from the front surface of the SiC semiconductor layer to a depth of 1,000 Å is smaller than the first-conductivity-type impurity concentration.

In the SiC semiconductor device, the electrode may be formed to cover a peripheral edge portion of the field insulation film around the opening. The electrode may include a barrier-forming electrode for forming an electric potential barrier through a junction with the SiC semiconductor layer. The barrier-forming electrode may be made of a metal for forming a Schottky junction through the junction with the SiC semiconductor layer. The barrier-forming electrode may be made of a polysilicon for forming a hetero-junction through the junction with the SiC semiconductor layer.

According to another embodiment of the present disclosure, there is provided a SiC semiconductor device, including: a first-conductivity-type SiC semiconductor layer; a MIS (Metal Insulator Semiconductor) transistor structure formed in the SiC semiconductor layer, the MIS transistor structure including a first-conductivity-type source region, a second-conductivity-type body region making contact with the source region, a first-conductivity-type drift region making contact with the body region and a gate electrode opposed to the body region across a gate insulation film and configured to form a channel in the body region to allow an electric current to flow between the drift region and the source region; a second-conductivity-type guard ring formed in a surface layer portion of the SiC semiconductor layer and configured to surround the MIS transistor structure; a field insulation film formed on a front surface of the SiC semiconductor layer and provided with an opening for exposing therethrough the source region and the guard ring; and a source electrode connected to the source region and the guard ring through the opening of the field insulation film, a second-conductivity-type impurity concentration in a surface layer portion of the guard ring making contact with the source electrode being smaller than a first-conductivity-type impurity concentration.

With this configuration, the MIS transistor structure is formed in the SiC semiconductor layer. The second-conductivity-type guard ring is formed to surround the MIS transistor structure. Since the guard ring is formed around the MIS transistor structure (transistor element), a depletion layer is broadened around the transistor element by the p-n junction of the SiC semiconductor layer and the guard ring. This makes it possible to reduce the field intensity on an element surface and to enhance the breakdown voltage of a device.

In addition, the source electrode for operating the MIS transistor structure is connected not only to the source region but also to the guard ring surrounding the MIS transistor structure. Thus, when avalanche breakdown occurs in the MIS transistor, the breakdown current can be bypassed to flow toward the guard ring arranged around the MIS transistor. In this case, there is a possibility that an electric current is concentrated on the terminal end portion of the source electrode (the outer edge portion of the source electrode within the opening of the field insulation film) connected to the guard ring, thereby destroying a device.

In the present disclosure, however, the second-conductivity-type impurity concentration is smaller than the first-conductivity-type impurity concentration in the surface layer portion of the guard ring making contact with the source electrode. In other words, the second-conductivity-type impurity concentration is smaller than the first-conductivity-type impurity concentration in the surface layer portion of the guard ring. The surface layer portion shows a first-conductivity-type property rather than a second-conductivity-type property. Accordingly, when avalanche breakdown occurs, it is possible to disperse the current density in the vicinity of the guard ring or to shift the portion having a relatively high current density to an inner position from the outer edge portion of the source electrode within the opening of the field insulation film while dispersing the current density. As a consequence, even with the occurrence of avalanche breakdown, it is possible to reduce the density of electric current flowing toward the outer edge portion of the source electrode connected to the guard ring. This makes it possible to prevent destruction of a device otherwise caused by avalanche breakdown.

BRIEF DESCRIPTION OF THE DRAWINGS

FIG. 9 is a view showing a current density distribution in a Schottky barrier diode of Example 2.

FIG. 11 is a view showing a current density distribution in a Schottky barrier diode of Comparative Example 1.

DETAILED DESCRIPTION

Figure 1A:
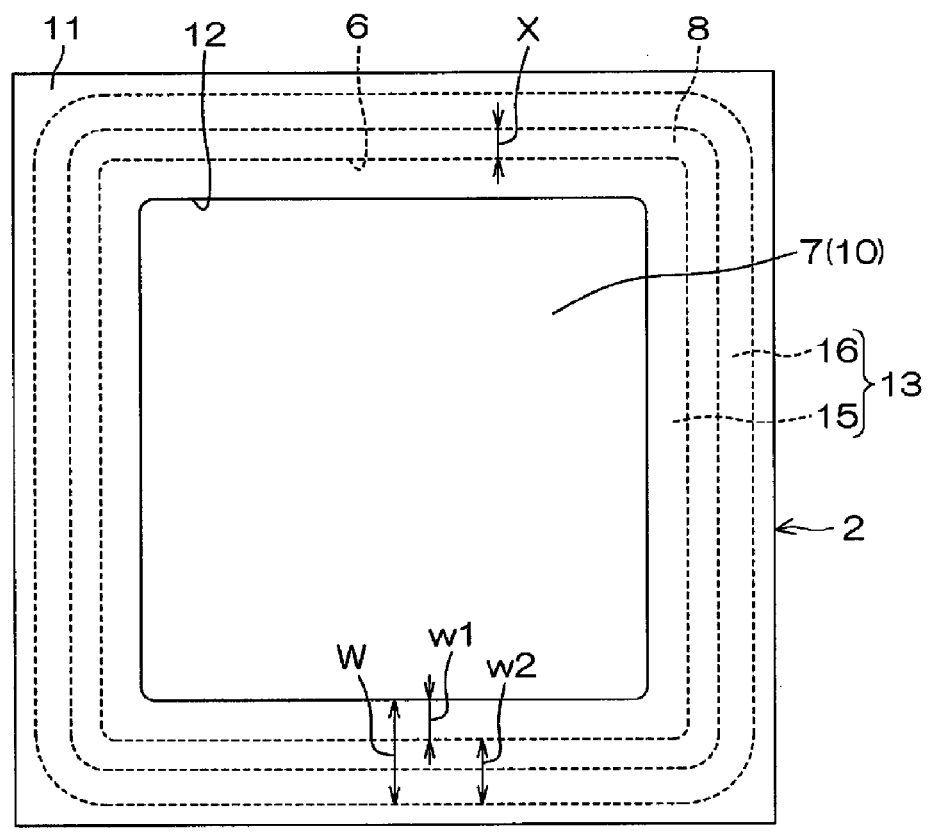
FIGS. 1A and 1B are schematic views showing a Schottky barrier diode according to a first embodiment of the present disclosure, FIG. 1A being a plan view thereof and FIG. 1B being a section view thereof.
Figure 1B:
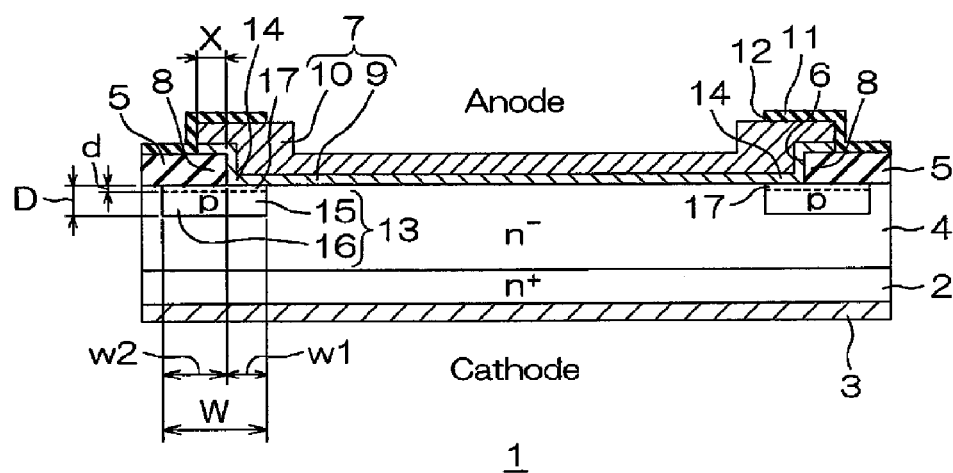

Certain embodiments of the present disclosure will now be described in detail with reference to the accompanying drawings. FIGS. 1A and 1B are schematic views showing a Schottky barrier diode according to a first embodiment of the present disclosure, FIG. 1A being a plan view thereof and FIG. 1B being a section view thereof. The Schottky barrier diode 1 employs SiC and, as shown in FIG. 1A, has, e.g., a square chip shape when seen in a plan view. The Schottky barrier diode 1 having a square chip shape is about several millimeters in the vertical and horizontal length on the sheet surface in FIG. 1A.

The Schottky barrier diode 1 includes a n$^+$ type SiC substrate 2 (having a concentration of, e.g., $1\times10^{18}$ to $1\times10^{21}$ cm$^{-3}$). On a rear surface of the SiC substrate 2, a cathode electrode 3 is formed to cover the entire region thereof. The cathode electrode 3 is made of metal (e.g., Ni silicide or Co silicide) making ohmic contact with the n-type SiC. Formed on a front surface of the SiC substrate 2 is an n$^-$ type SiC epitaxial layer 4 (an SiC semiconductor layer having a concentration of, e.g., $1\times10^{15}$ to $1\times10^{17}$ cm$^{-3}$) which is lower in concentration than the SiC substrate 2. The SiC epitaxial layer 4 has a thickness of, e.g., 1 μm to 100 μm.

A field insulation film 5 made of silicon oxide (SiO$_2$) is formed on a front surface of the SiC epitaxial layer 4. The thickness of the field insulation film 5 is, e.g., 1,000 Å or more, and in some embodiments from 3,000 Å to 30,000 Å. The field insulation film 5 may be made of silicon nitride (SiN) or other insulating materials. The field insulation film 5 has an opening 6 for exposing the central portion of the SiC epitaxial layer 4 therethrough. An anode electrode 7 is formed on the field insulation film 5.

The anode electrode 7 fills up the opening 6 of the field insulation film 5 and extends outwards from the opening 6 in the form of a flange to cover a peripheral edge portion 8 of the field insulation film 5 around the opening 6. In other words, the peripheral edge portion 8 of the field insulation film 5 is sandwiched between the upper and lower sides thereof by the anode electrode 7 and the SiC epitaxial layer 4 over the full perimeter thereof. The protruding amount X of the anode electrode 7, which covers the peripheral edge portion 8 of the field insulation film 5, from the end of the opening 6 of the field insulation film 5 is, e.g., 10 μm or more, and in some embodiments from 10 μm to 100 μm.

The anode electrode 7 has a two-layer structure including, e.g., a Schottky metal 9 as a barrier-forming electrode connected to the SiC epitaxial layer 4 within the opening 6 of the field insulation film 5 and a contact metal 10 formed on the Schottky metal 9. The Schottky metal 9 is made of metal (e.g., Ni or Au) which forms a Schottky junction when in contact with the n-type SiC. The Schottky metal 9 connected to the n-type SiC forms a Schottky barrier (electric potential barrier) of, e.g., 0.7 eV to 1.7 eV between itself and the n-type SiC semiconductor. In the present embodiment, the thickness of the Schottky metal 9 is, e.g., from 0.01 µm to 5 µm.

A contact metal 10 of the anode electrode 7 is a portion exposed in a front-most surface of the Schottky barrier diode 1. Bonding wires are bonded to the contact metal 10. The contact metal 10 is made of, e.g., Al. In the present embodiment, the thickness of the contact metal 10 is greater than the thickness of the Schottky metal 9 and is, e.g., from 0.5 µm to 10 µm. A surface protection film 11 is formed on the front-most surface of the Schottky barrier diode 1. The surface protection film 11 has an opening 12 formed in the central portion thereof to expose the contact metal 10 therethrough. The bonding wires are bonded to the contact metal 10 through the opening 12.

A p-type guard ring 13 is formed in a surface layer portion of the SiC epitaxial layer 4 to make contact with the Schottky metal 9 of the anode electrode 7. When seen in a plan view, the guard ring 13 is formed along the contour of the opening 6 of the field insulation film 5 to extend over the inside and outside of the opening 6. The guard ring 13 includes an inner portion 15 extending toward the inside of the opening 6 and making contact with an outer edge portion 14, i.e., a terminal end portion, of the Schottky metal 9 within the opening 6 and an outer portion 16 extending toward the outside of the opening 6 and opposite the anode electrode 7 (or the Schottky metal 9) with the peripheral edge portion 8 of the field insulation film 5 interposed therebetween. The width w1 of the inner portion 15 of the guard ring 13 is from 1 µm to 50 µm and the width w2 of the outer portion 16 of the guard ring 13 is from 1 µm to 500 µm. The total width W of the guard ring 13, i.e., the sum of w1 and w2, is, e.g., from 2 µm to 550 µm. The depth D of the guard ring 13 from the front surface of the SiC epitaxial layer 4 is, e.g., 1,000 Å or more, and in some embodiments from 2,000 Å to 7,000 Å.

In a great part of the p-type guard ring 13, a p-type impurity concentration is greater than an inherent n-type impurity concentration of the n⁻ type SiC epitaxial layer 4. In a surface layer portion 17 of the guard ring 13, however, the p-type impurity concentration is smaller than the n-type impurity concentration. Certain Examples will now be described with reference to FIGS. 2 through 4.

Figure 2:
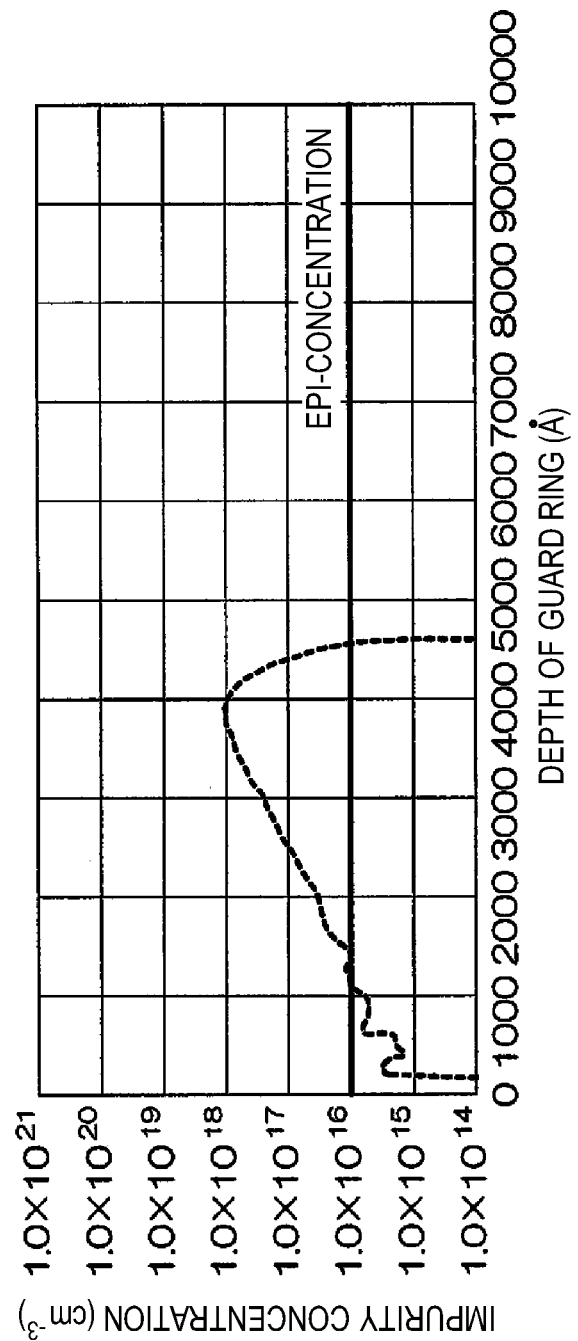
FIG. 2 is a view representing profiles of n-type and p-type impurity concentrations in a guard ring according to the first embodiment of the present disclosure (first example).
Figure 3:
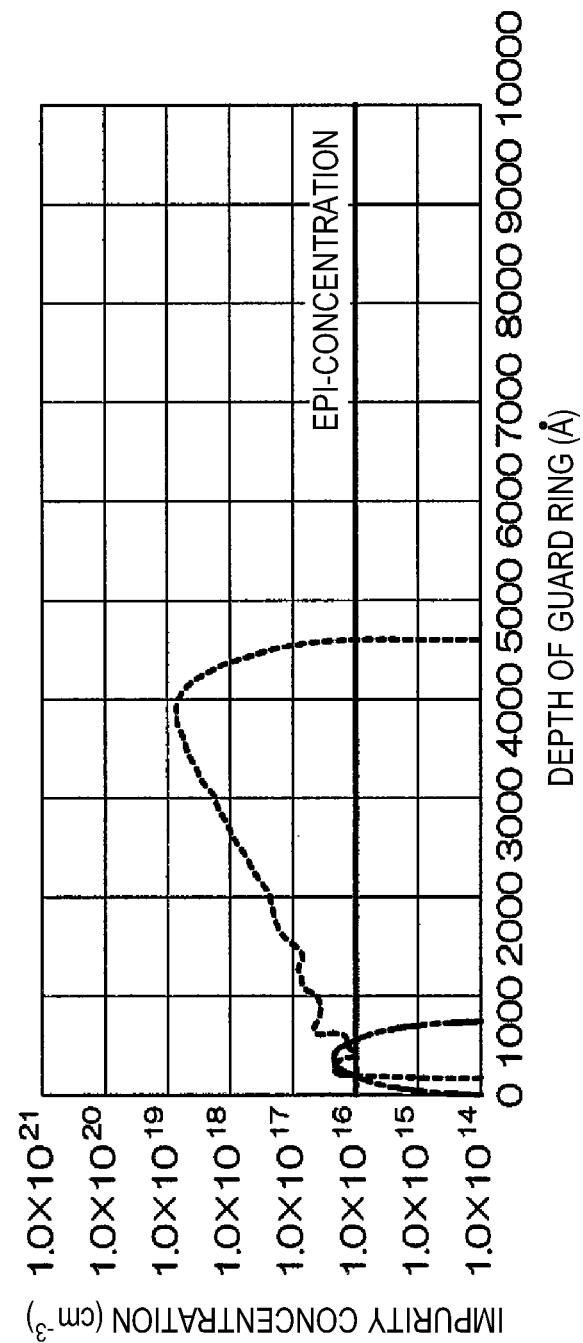
FIG. 3 is a view representing profiles of n-type and p-type impurity concentrations in the guard ring according to the first embodiment of the present disclosure (second example).
Figure 4:
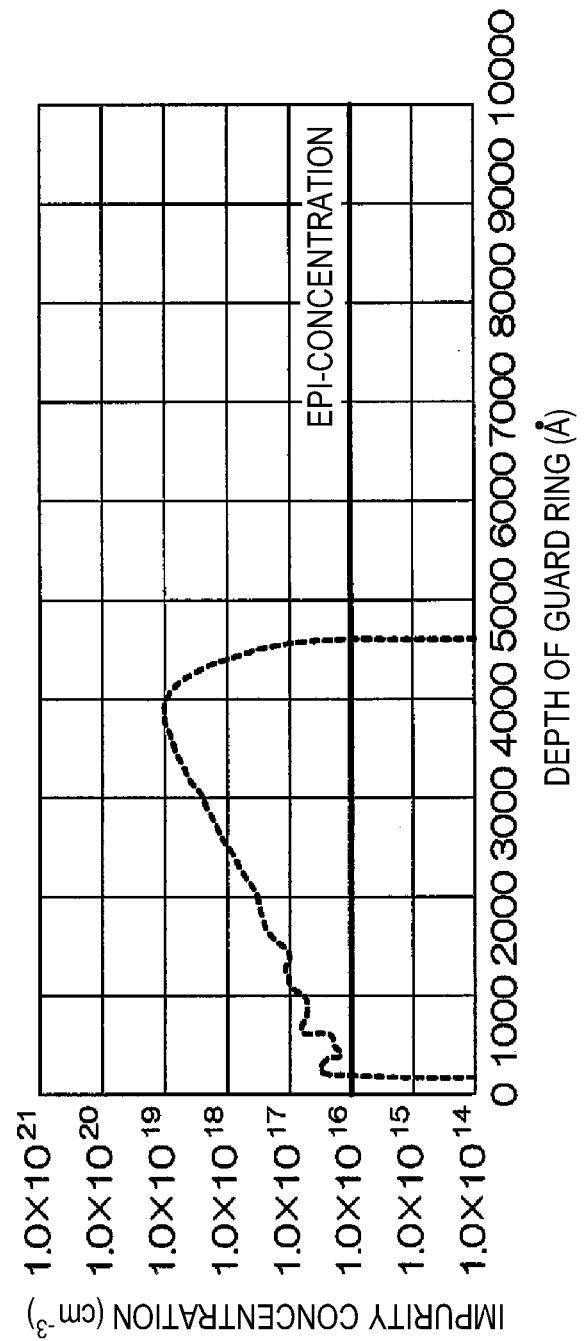
FIG. 4 is a view representing profiles of n-type and p-type impurity concentrations in a guard ring (reference example).

FIG. 2 is a view representing profiles of the n-type and p-type impurity concentrations in the guard ring 13 according to the first embodiment of the present disclosure (first example). FIG. 3 is a view representing profiles of the n-type and p-type impurity concentrations in the guard ring 13 according to the first embodiment of the present disclosure (second example). FIG. 4 is a view representing profiles of the n-type and p-type impurity concentrations in the guard ring 13 (reference example).

Referring to FIG. 2, an n-type impurity (e.g., N or nitrogen, P or phosphorus, As or arsenic, etc) is substantially uniformly distributed throughout the n⁻ type SiC epitaxial layer 4 over the entire layer in a concentration (epi-concentration) of $1.0 \times 10^{16}$ cm$^{-3}$. A p-type impurity (e.g., B or boron, Al or aluminum, etc) as well as the n-type impurity is contained in the p-type guard ring 13. The p-type impurity is not uniformly distributed throughout the entire layer of the guard ring 13 but is distributed so that the concentration thereof increases as the depth from the front surface of the SiC epitaxial layer 4 becomes greater. More specifically, a low distribution of p-type impurity is found in a portion (having a depth of about 0 to 200 Å) of the guard ring 13 near the front surface of the SiC epitaxial layer 4. At a depth of about 200 Å to 1,000 Å, the p-type impurity is increased to a concentration range (of $1.0 \times 10^{14}$ cm$^{-3}$ to $1.0 \times 10^{16}$ cm$^{-3}$) which is smaller than the impurity concentration in the SiC epitaxial layer 4. At a depth of about 1,000 Å, the impurity concentration in the guard ring 13 is substantially equal to the impurity concentration ($1.0 \times 10^{16}$ cm$^{-3}$) in the SiC epitaxial layer 4. At a depth of 1,000 Å to 4,600 Å, the p-type impurity is increased to a concentration range (of $1.0 \times 10^{16}$ cm$^{-3}$ to $1.0 \times 10^{20}$ cm$^{-3}$) which is greater than the impurity concentration in the SiC epitaxial layer 4. In the example shown in FIG. 2, the p-type impurity concentration in the surface layer portion 17 of the guard ring 13 extending from the front surface of the SiC epitaxial layer 4 to the depth d of 1,000 Å or less (e.g., in the depth position having a depth of 0 to 30% of the depth D of the guard ring 13) is smaller than the n-type impurity concentration.

Such a concentration profile can be realized by, e.g., injecting a p-type impurity (e.g., in a dose amount of $1.0 \times 10^{12}$ cm$^{-2}$ to $1.0 \times 10^{15}$ cm$^{-2}$ and in an acceleration energy of 30 keV to 100 keV) into the SiC epitaxial layer 4 containing an n-type impurity in a substantially uniform concentration over the entire layer, so that the acceptor density can become smaller than the donor density in the portion extending from the front surface of the SiC epitaxial layer 4 (0 in depth) to a depth of 1,000 Å, and activating the p-type impurity through an annealing process.

In the example shown in FIG. 3, unlike the example shown in FIG. 2, the p-type impurity is increased even at a depth of about 200 Å to 1,000 Å to a concentration range which is greater than the impurity concentration in the SiC epitaxial layer 4. In the example shown in FIG. 3, however, an n-type impurity other than the inherent n-type impurity of the SiC epitaxial layer 4 (the n-type impurity contained during formation of the SiC epitaxial layer 4) is introduced at a depth of about 200 Å to 600 Å as indicated by a single-dot chain line in FIG. 3. At a depth of about 200 Å to 600 Å, therefore, the n-type impurity in the SiC epitaxial layer 4 is supplemented by the introduced n-type impurity, and thus the p-type impurity concentration becomes smaller than the n-type impurity concentration.

Such a concentration profile can be realized by, e.g., injecting a p-type impurity (e.g., in a dose amount of $1.0 \times 10^{14}$ cm$^{-2}$ to $1.0 \times 10^{16}$ cm$^{-2}$ and in an acceleration energy of 80 keV to 400 keV) into the SiC epitaxial layer 4 containing an n-type impurity in a substantially uniform concentration over the entire layer so that the acceptor density can become greater than the donor density, injecting an n-type impurity (e.g., in a dose amount of $1.0 \times 10^{12}$ cm$^{-2}$ to $1.0 \times 10^{14}$ cm$^{-2}$ and in an acceleration energy of 30 keV to 100 keV) into the region injected with the p-type impurity, and then activating the n-type and p-type impurities through an annealing process.

Referring to FIG. 4 which shows an example associated with a conventional guard ring 13, the p-type impurity is increased even in the depth position of about 200 Å to 1,000 Å to a concentration range greater than the impurity concentration in the SiC epitaxial layer 4 as in the example shown FIG. 3. In the example shown in FIG. 4, unlike the example shown in FIG. 3, the n-type impurity is not additionally injected. In the example shown in FIG. 4, therefore, the p-type impurity concentration is greater than the n-type impurity concentration over substantially the entire region of the guard ring 13 at a depth of about 200 Å to 46,000 Å.

As described above, in the Schottky barrier diode 1, the guard ring 13 is formed to extend over the inside and outside of the opening 6 of the field insulation film 5. The inner portion 15 of the guard ring 13 makes contact with the outer edge portion 14 of the Schottky metal 9 within the opening 6. In the guard ring 13, as in the examples shown in FIGS. 2 and 3, the p-type impurity concentration in the surface layer portion 17 of the guard ring 13 extending from the front surface of the SiC epitaxial layer 4 to the depth d of 1,000 Å or less (e.g., in the position having a depth of 0 to 30% of the depth D of the guard ring 13) is smaller than the n-type impurity concentration. In the surface layer portion 17 of the guard ring 13, the p-type impurity concentration is smaller than the n-type impurity concentration, and the surface layer portion 17 shows an n-type property rather than a p-type property.

Accordingly, when an electric current flows through the SiC epitaxial layer 4 of the Schottky barrier diode 1, it is possible to disperse a current density within the SiC epitaxial layer 4 or to shift a portion having a relatively high current density to the central portion of the anode electrode 7 while dispersing the current density. As a consequence, even if avalanche breakdown occurs by a large reverse voltage applied between the anode electrode 7 and the cathode electrode 3, it is possible to reduce the density of an electric current flowing toward the outer edge portion 14 of the anode electrode 7 (or the Schottky metal 9). This makes it possible to prevent destruction of the device otherwise caused by the avalanche breakdown.

Since a depletion layer is broadened near the outer edge portion 14 of the anode electrode 7 by the p-n junction of the SiC epitaxial layer 4 and the guard ring 13, it is possible for the depletion layer to restrain an electric field from concentrating on the outer edge portion 14 of the anode electrode 7. This assists in enhancing the breakdown voltage of the device.

Figure 5:
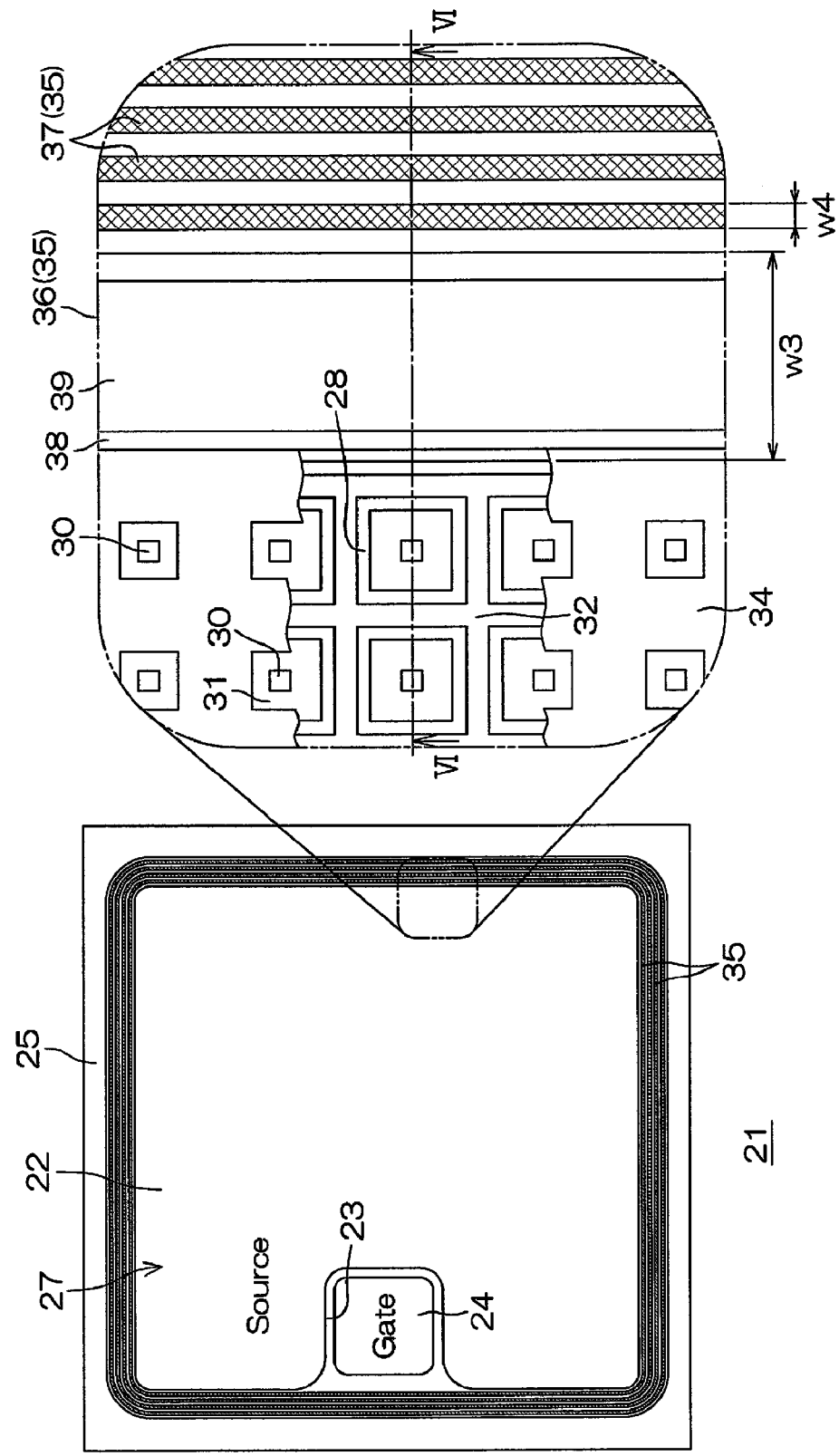
FIGS. 5A and 5B are schematic views showing a field-effect transistor according to a second embodiment of the present disclosure, FIG. 5A being a plan view thereof and FIG. 5B being an enlarged view of the inside thereof.
Figure 6:
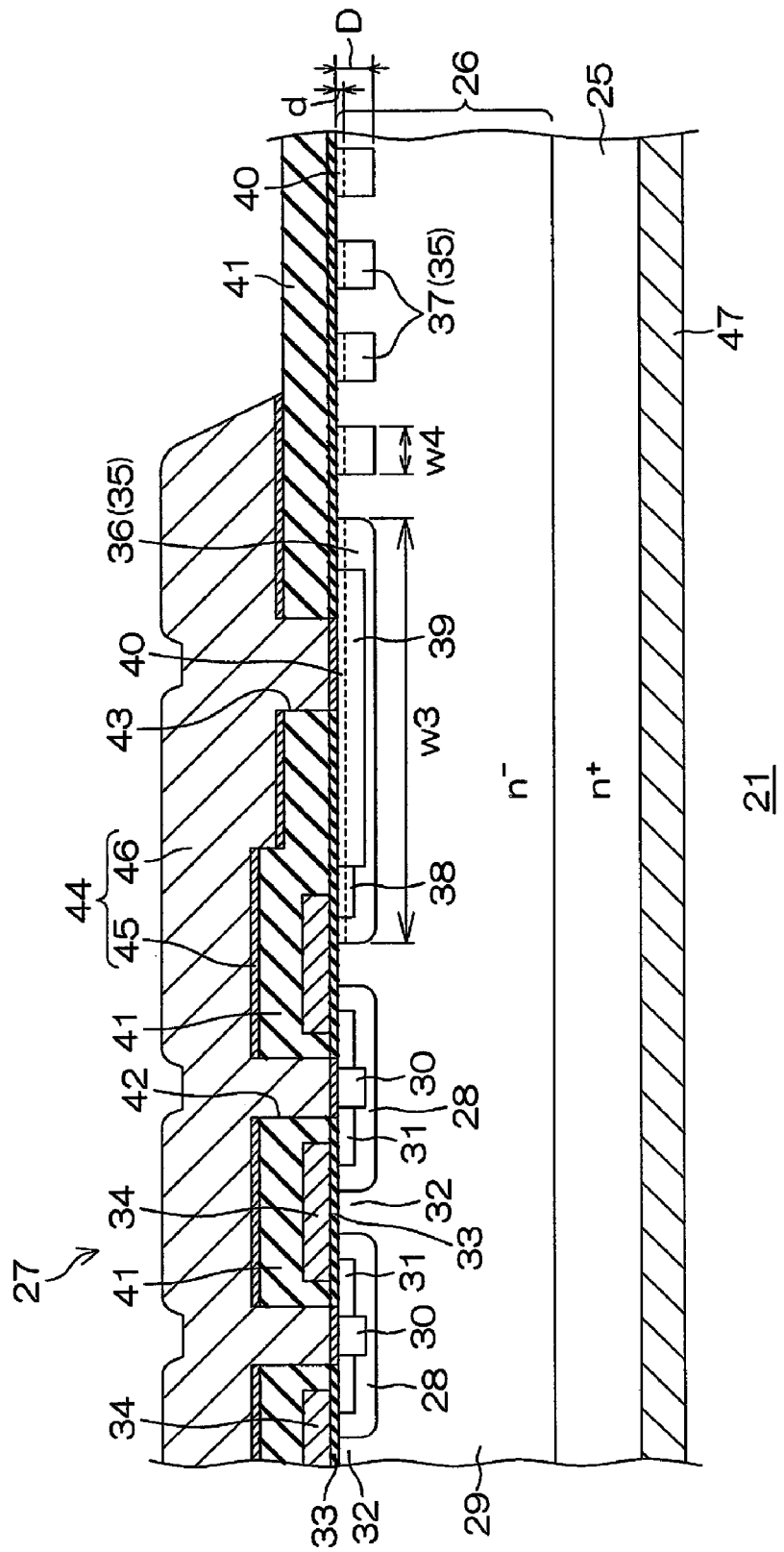
FIG. 6 is a schematic section view showing the field-effect transistor according to the second embodiment of the present disclosure, which is taken along line VI-VI in FIG. 5B.

FIGS. 5A and 5B are schematic views showing a field-effect transistor according to a second embodiment of the present disclosure, FIG. 5A being a plan view thereof and FIG. 5B being an enlarged view of the inside thereof. FIG. 6 is a schematic section view showing the field-effect transistor according to the second embodiment of the present disclosure, which is taken along line VI-VI in FIG. 5B.

The field-effect transistor 21 is a DMISFET (Double-diffused Metal Insulator Semiconductor Field Effect Transistor) employing SiC. As shown in FIG. 5A, the field-effect transistor 21 has a square chip shape when seen in a plan view. The field-effect transistor 21 is about several millimeters in the vertical and horizontal length on the sheet surface in FIG. 5A. A source pad 22 is formed on the front surface of the field-effect transistor 21. The source pad 22 has a generally square shape when seen in a plan view with four corners thereof being rounded. The source pad 22 is formed to cover substantially the entire region of a front surface of the field-effect transistor 21. A removed region 23 is formed near the middle portion of one side of the source pad 22. The source pad 22 is not formed in the removed region 23.

A gate pad 24 is arranged in the removed region 23. The gate pad 24 and source pad 22 are spaced apart and insulated from each other. Next, a description will be given on the internal structure of the field-effect transistor 21. The field-effect transistor 21 includes an $n^+$ type SiC substrate 25 (having a concentration of, e.g., $1\times10^{18}$ cm$^{-3}$ to $1\times10^{21}$ cm$^{-3}$).

On a front surface of the SiC substrate 25, there is formed an $n^-$ type SiC epitaxial layer 26 (or a SiC semiconductor layer) (having a concentration of, e.g., $1\times10^{15}$ cm$^{-3}$ to $1\times10^{17}$ cm$^{-3}$) which is lower in concentration than the SiC substrate 25. The thickness of the SiC epitaxial layer 26 is, e.g., from 1 μm to 100 μm. As shown in FIG. 5A, the field-effect transistor 21 includes an active region 27 arranged in the central portion of the SiC epitaxial layer 26 when seen in a plan view. The active region 27 serves as the field-effect transistor 21.

In a surface layer portion of the SiC epitaxial layer 26 in the active region 27, a plurality of p-type body regions 28 is arranged at a regular pitch along a row direction and a column direction in a matrix pattern. Each of the body regions 28 has a square shape when seen in a plan view and is, e.g., about 7.2 μm in vertical and horizontal length on the sheet surface in FIG. 5B. An impurity concentration of the body regions 28 is, e.g., from $1.0\times10^{16}$ cm$^{-3}$ to $1.0\times10^{19}$ cm$^{-3}$). A region of the SiC epitaxial layer 26 between the body regions 28 and the SiC substrate 25 remains in an epitaxially grown state and becomes an $n^-$ type drift region 29.

Each of the body regions 28 includes a $p^+$ type body contact region 30 (having an impurity concentration of, e.g., $1.0\times10^{18}$ cm$^{-3}$ to $1.0\times10^{21}$ cm$^{-3}$) formed in the central portion thereof and an $n^+$ type source region 31 (having an impurity concentration of, e.g., $1.0\times10^{18}$ cm$^{-3}$ to $1.0\times10^{21}$ cm$^{-3}$) formed to surround the body contact region 30. The body contact region 30 has a square shape when seen in a plan view and is, e.g., about 1.6 μm in vertical and horizontal length on the sheet surface in FIG. 5B.

The source region 31 has a square shape when seen in a plan view and is, e.g., about 5.7 μm n in vertical and horizontal length on the sheet surface in FIG. 5B. In the active region 27, a region between the body regions 28 arranged at a regular pitch in a matrix pattern (an inter-body region 32 interposed between the side surfaces of the body regions 28 adjoining each other) is formed into a lattice shape with a specified width (e.g., 2.8 μm).

A lattice-like gate insulation film 33 is formed on the inter-body region 32 to extend along the inter-body region 32. The gate insulation film 33 extends between the body regions 28 adjoining each other and covers portions of the body regions 28 surrounding the source regions 31 (namely, peripheral edge portions of the body regions 28) and outer edge portions of the source regions 31. The gate insulation film 33 is made of silicon oxide ($SiO_2$). The gate insulation film 33 has a substantially uniform thickness of about 400 Å.

A gate electrode 34 is formed on the gate insulation film 33. The gate electrode 34 is formed into a lattice shape to extend along the gate insulation film 33. The gate electrode 34 is located opposite the peripheral edge portions of the body regions 28 across the gate insulation film 33. The gate electrode 34 is made of polysilicon. For example, a p-type impurity is introduced into the gate electrode 34 at a high concentration. The gate electrode 34 has a thickness of, e.g., 6,000 Å.

In the field-effect transistor 21, a border between unit cells is set in a transverse center of the inter-body region 32. Each of the unit cells is, e.g., about 10 μm in vertical and horizontal length on the sheet surface in FIG. 5B. In each of the unit cells, a depth direction of the body regions 28 is a gate length direction and a circumferential direction of the body regions 28 orthogonal to the gate length direction is a gate width direction. In each of the unit cells, an annular channel is formed in the peripheral edge portions of the body region 28 of each of the unit cells by controlling the voltage applied to the gate electrode 34. Thus, a drain current flowing toward the front surface of the SiC epitaxial layer 26 along the four side surfaces of each of the body regions 28 in the drift region 29 can be flown to the source region 31. In other words, a MIS transistor structure is provided in each of the unit cells.

In the surface layer portion of the SiC epitaxial layer 26, a plurality of (five, in the present embodiment) of p-type guard rings 35 is formed in spaced-apart relationship with the active region 27 to surround the unit cells arranged in a matrix pattern (or the active region 27). The guard rings 35 can be formed in an ion implantation process which is the same as the process of forming the p-type body regions 28.

When seen in a plan view, each of the guard rings 35 is formed into a rectangular ring shape to extend along an outer circumference of the field-effect transistor 21. The depth D of the guard rings 35 from the front surface of the SiC epitaxial layer 26 is substantially equal to the depth of the body regions 28 and is, e.g., 2,000 Å or more and in some embodiments from 3,000 Å to 10,000 Å. In an innermost guard ring 36 (having a width w3) among the guard rings 35, an $n^+$ type region 38 and a $p^+$ type region 39 are formed in a mutually adjoining relationship. The $n^+$ type region 38 and the $p^+$ type region 39 are formed into a rectangular ring shape, when seen in a plan view, over a full circumference of the guard ring 36. The $n^+$ type region 38 can be formed in an ion implantation process which is the same as the process of forming the $n^+$ type source region 31. The $p^+$ type region 39 can be formed in an ion implantation process which is the same as the process of forming the $p^+$ type body contact region 30. Each of the guard rings 37 other than the innermost guard ring 36 has a width w4 of, e.g., 1 µm to 3 µm.

In the second embodiment, the p-type impurity concentration in most portions of the p-type guard rings 35 is greater than an inherent n-type impurity concentration of the $n^-$ type SiC epitaxial layer 26. However, as shown in FIGS. 2 through 4 of the foregoing embodiment, the p-type impurity concentration is smaller than the n-type impurity concentration in the surface layer portions 40 of the guard rings 35. In particular, since the $p^+$ type region is formed in the surface layer portion 40 of the innermost guard ring 36, it is preferred in some embodiments that, as in the example shown in FIG. 3, the n-type impurity of the SiC epitaxial layer 26 be supplemented by additionally implanting the n-type impurity into the SiC epitaxial layer 26.

An inter-layer insulation film 41 made of silicon oxide ($SiO_2$) is formed on the SiC epitaxial layer 26 as a field insulation film to cover the gate electrode 34. The inter-layer insulation film 41 has a contact hole 42 for exposing therethrough the source region 31 and the body contact region 30. The inter-layer insulation film 41 also has a contact hole 43 for exposing therethrough the innermost guard ring 36.

A source electrode 44 is formed on the inter-layer insulation film 41. The source electrode 44 makes simultaneous contact with the body contact regions 30 and the source regions 31 of all the unit cells and the $p^+$ type region 39 of the innermost guard ring 36 through the contact holes 42 and 43. In other words, the source electrode 44 provides common wiring lines to all the unit cells. An inter-layer insulation film (not shown) is formed on the source electrode 44. The source electrode 44 is electrically connected to the source pad 22 (see FIG. 5A) through the inter-layer insulation film (not shown). The gate pad 24 (see FIG. 5A) is electrically connected to the gate electrode 34 through a gate wiring line (not shown) drawn onto the inter-layer insulation film (not shown).

The source electrode 44 has a structure in which a Ti/TiN layer 45 and an Al layer 46 are formed one above the other from the side at which the source electrode 44 makes contact with the SiC epitaxial layer 26. A drain electrode 47 is formed on a rear surface of the SiC substrate 25 to cover the entire region thereof. The drain electrode 47 serves as a common electrode with respect to all the unit cells. As the drain electrode 47, it is possible to employ, e.g., a laminated structure (Ti/Ni/Au/Ag) in which Ti, Ni, Au and Ag are laminated one above another from the side of the SiC substrate 25.

As set forth above, the guard rings 35 are formed around the matrix-like unit cells in the field-effect transistor 21. Therefore, a depletion layer is broadened around the active region 27 by the p-n junction of the SiC epitaxial layer 26 and the guard rings 35. This makes it possible to reduce electric field intensity on element surfaces of the respective unit cells. Accordingly, it is possible to enhance the breakdown voltage of a device.

In addition, the source electrode 44 for operating the respective unit cells is connected not only to the source region 31 and the body contact region 30 but also to the innermost guard ring 36 surrounding the active region 27. Thus, when avalanche breakdown occurs in the field-effect transistor 21, the breakdown current can be bypassed to flow toward the innermost guard ring 36 arranged around the active region 27. In this case, there is a possibility that an electric current is concentrated on the outer edge portion of the source electrode 44 within the contact hole 43 of the inter-layer insulation film 41, thereby destroying a device.

In the present embodiment, however, the p-type impurity concentration is smaller than the n-type impurity concentration in the surface layer portions 40 of the guard rings 35 extending from the front surface of the SiC epitaxial layer 26 to the depth d of 1,000 Å or less (e.g., in the portion having a depth of 0 to 5% of the depth D of the guard rings 35). In other words, the p-type impurity concentration is smaller than the n-type impurity concentration in the surface layer portions 40 of the guard rings 35. The surface layer portion 40 shows an n-type property rather than a p-type property.

Accordingly, when an electric current flows through the SiC epitaxial layer 26 of the field-effect transistor 21, it is possible to disperse a current density in the vicinity of the innermost guard ring 36 having an increased width or to shift the portion having a relatively high current density to a central portion of the source electrode 44 within the contact hole 43 while dispersing the current density. As a consequence, even if avalanche breakdown occurs by a large reverse voltage applied between the source electrode 44 and the drain electrode 47, it is possible to reduce the density of an electric current flowing toward the outer edge portion of the source electrode 44. This makes it possible to prevent destruction of the device otherwise caused by avalanche breakdown.

Figure 7A:
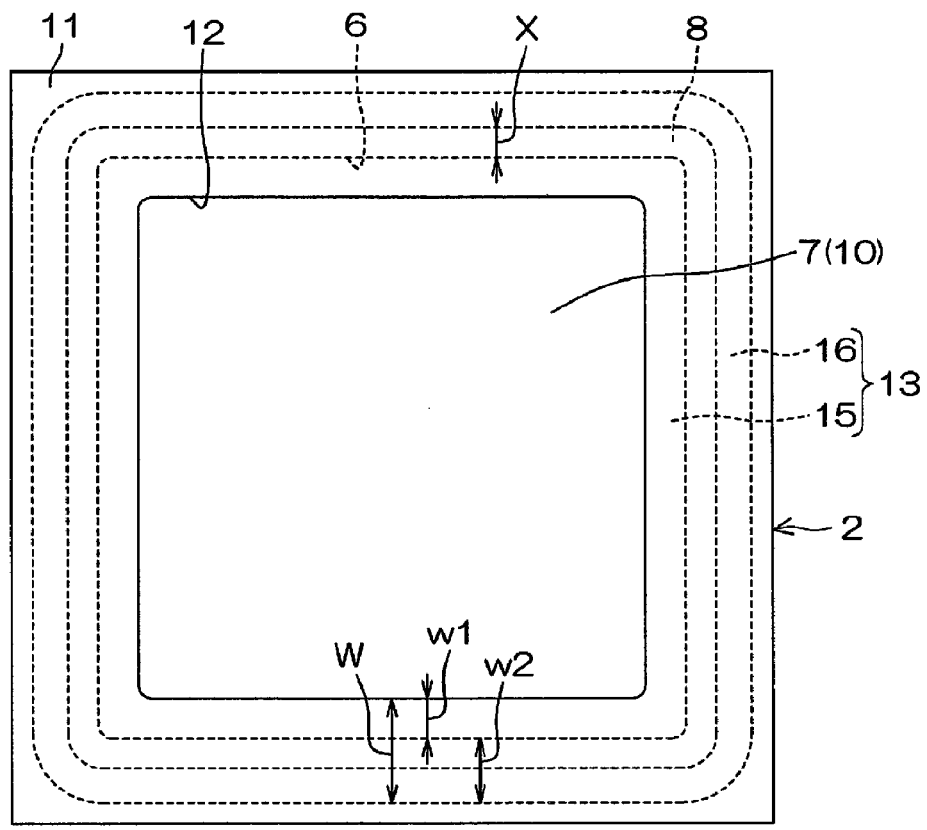
FIGS. 7A and 7B are schematic views showing a hetero-junction diode according to a third embodiment of the present disclosure, FIG. 7A being a plan view thereof and FIG. 7B being a section view thereof.
Figure 7B:
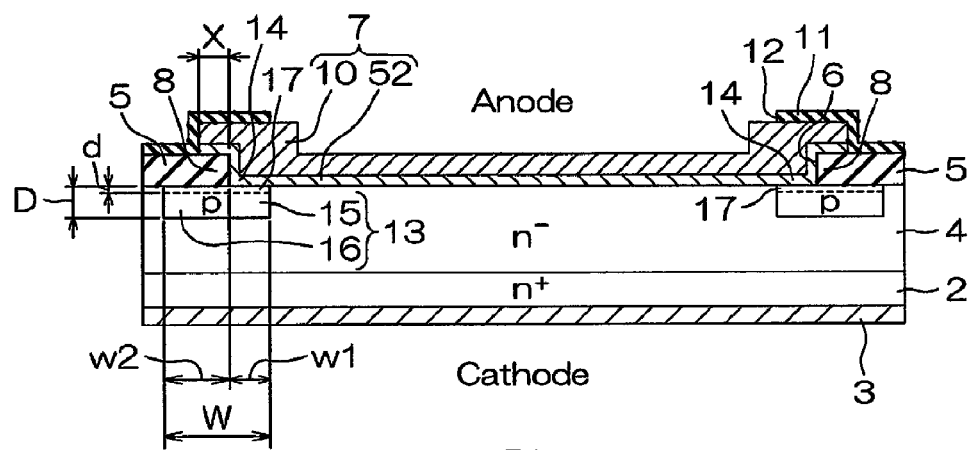
Figure 8:
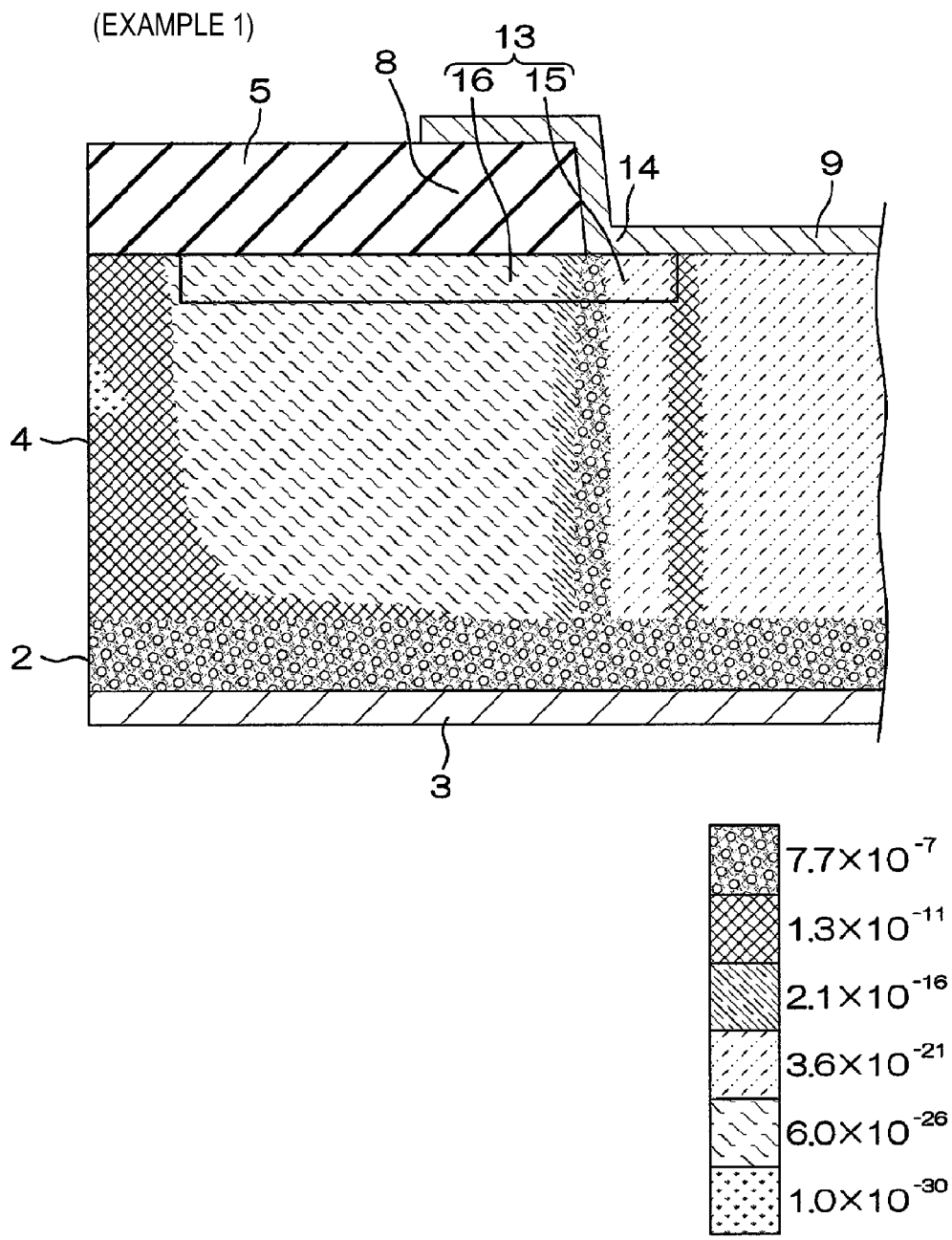
FIG. 8 is a view showing a current density distribution in a Schottky barrier diode of Example 1.

While certain embodiments of the present disclosure have been described above, the present disclosure may be embodied in other forms. For example, in case of the Schottky barrier diode 1 of the first embodiment, the Schottky metal 9 may be replaced by a polysilicon 52 as shown in FIGS. 7A and 7B, thereby providing a hetero-junction diode 51 in which the polysilicon 52 is hetero-connected to the SiC epitaxial layer 4. The polysilicon 52 connected to the SiC epitaxial layer 4 forms an electric potential barrier of, e.g., 0.5 eV to 1.8 eV between itself and the SiC epitaxial layer 4.

It may also be possible to employ a configuration in which the conductivity types of the respective semiconductor portions of the Schottky barrier diode 1, the field-effect transistor 21 and the hetero-junction diode 51 are inverted. In other words, the p-type portions may be changed to n-type portions and the n-type portions may be changed to p-type portions in the Schottky barrier diode 1, the field-effect transistor 21 and the hetero-junction diode 51.

The SiC semiconductor device of the present disclosure is primarily used in the systems in the field of power electronics, such as a motor control system and a power conversion system. More specifically, the SiC semiconductor device is incorporated into, and used in, e.g., an inverter circuit for a motor vehicle or an IPM (Intelligent Power Module). In addition, designs may be changed without departing from the scope of the invention defined in the claims.

Next, the present disclosure will be described based on examples and a comparative example. The present disclosure is not limited by the examples set forth below. Examples 1 through 3 and Comparative Example 1 are presented to demonstrate the current density dispersion effect provided by the present disclosure.

EXAMPLE 1

(1) Manufacture of Schottky Barrier Diode

A Schottky barrier diode having substantially the same structure as the Schottky barrier diode 1 described in respect of FIGS. 1A and 1B was manufactured.

More specifically, an epitaxial layer made of n⁻ type SiC was grown on an n⁺ type SiC substrate (in an n-type impurity concentration of $1 \times 10^{16}$ cm$^{-3}$). Phosphorus was used as an n-type impurity. Then, a p-type impurity (B) was injected into the epitaxial layer in a dose amount of $1.5 \times 10^{11}$ cm$^{-2}$ and at an acceleration energy of 30 keV. Subsequently, an n-type impurity (P) was injected into the epitaxial layer in a dose amount of $3.0 \times 10^{15}$ cm$^{-2}$ and at an acceleration energy of 180 keV. Thereafter, the n-type impurity and the p-type impurity were activated by performing an annealing process at 1,150° C. In this manner, a guard ring having a depth of 4,500 Å was selectively formed.

Thereafter, a field insulation film made of SiO$_2$ was formed on the epitaxial layer. An opening for exposing a portion of the guard ring therethrough was formed in the field insulation film. Then, a Schottky metal (Mo) was connected to the epitaxial layer through the opening of the field insulation film to make contact with the guard ring.

EXAMPLE 2

A Schottky barrier diode was manufactured in the same manner as in Example 1 except that the dose amount and the acceleration energy of the n-type impurity are changed to $3.0 \times 10^{11}$ cm$^{-2}$ and 30 keV, respectively.

EXAMPLE 3

A Schottky barrier diode was manufactured in the same manner as in Example 1 except that the dose amount and the acceleration energy of the n-type impurity are changed to $1.5 \times 10^{12}$ cm$^{-2}$ and 30 keV, respectively.

COMPARATIVE EXAMPLE 1

A Schottky barrier diode was manufactured in the same manner as in Example 1 except that the n-type impurity is not injected when forming the guard ring.

<Current Density Simulation>

A current density distribution within the epitaxial layer was simulated when a reverse voltage (760 V) is applied between an anode electrode and a cathode electrode of each of the Schottky barrier diodes obtained in Examples 1 through 3 and Comparative Example 1. The results of the simulation are shown in FIGS. 8 through 11. In FIGS. 8 through 11, the portions corresponding to the portions shown in FIGS. 1A and 1B are designated by the same reference symbols.

Referring to FIG. 11, it can be appreciated that, in the Schottky barrier diode of Comparative Example 1, a large current intensively flows in the outer edge portion of the Schottky metal. In contrast, it can be noted in FIG. 8 that, in the Schottky barrier diode of Example 1, a large current intensively flows in the outer edge portion of the Schottky metal as compared with other portions. However, the intensity of the current is not so great as to destroy a device. In other words, it can be seen that the density of current flowing in the outer edge portion of the Schottky metal is reduced.

Figure 10:
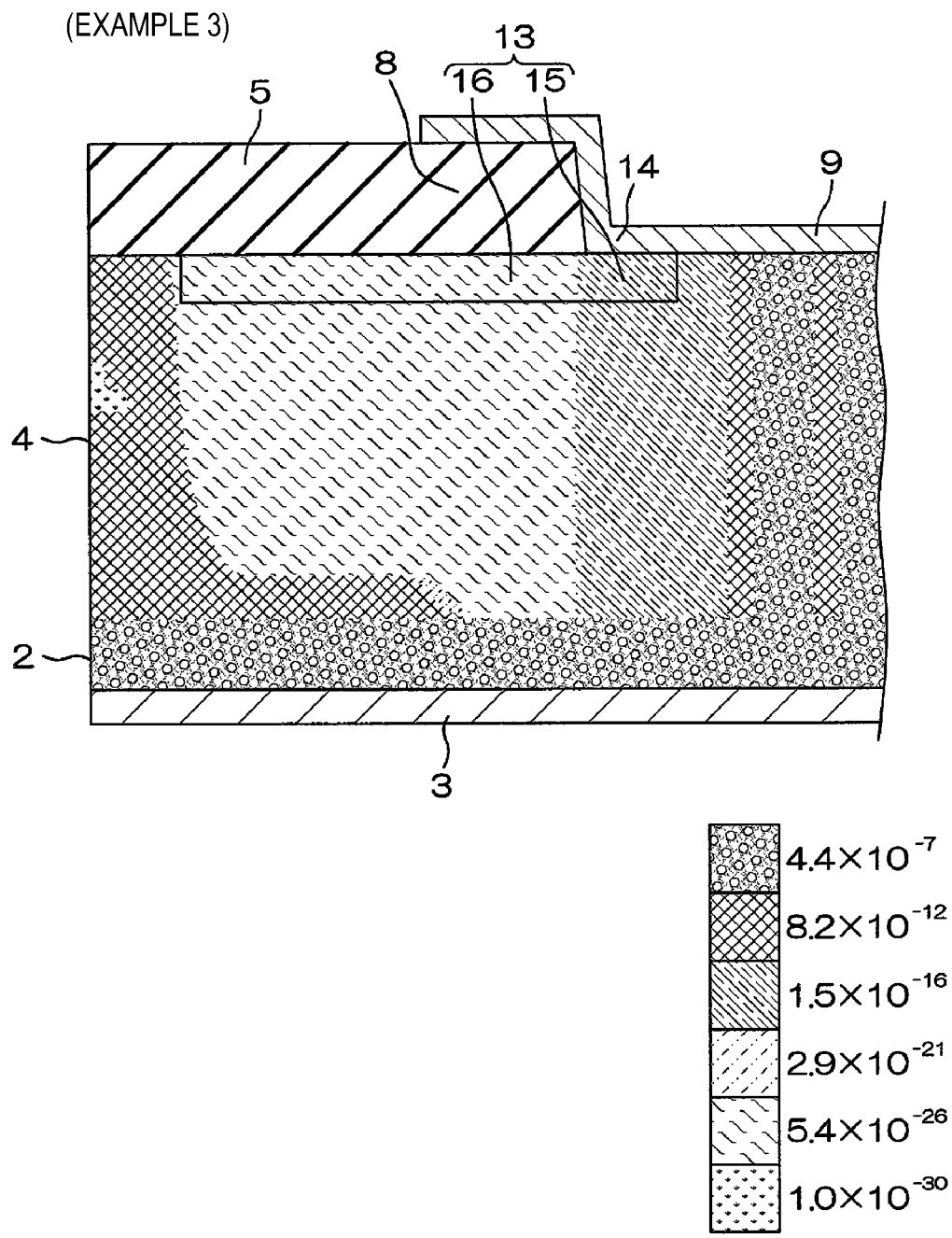
FIG. 10 is a view showing a current density distribution in a Schottky barrier diode of Example 3.

Referring to FIGS. 9 and 10, it can be confirmed that, in the Schottky barrier diodes of Examples 2 and 3, the density of a current flowing in the outer edge portion of the Schottky metal is further reduced and that the portion having a relatively high current density is shifted to the central portion of the Schottky metal.

While certain embodiments have been described, these embodiments have been presented by way of example only, and are not intended to limit the scope of the disclosures. Indeed, the novel SiC semiconductor devices described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A SiC semiconductor device, comprising:
a SiC semiconductor layer having a first-conductivity-type impurity;
a field insulation film formed on a front surface of the SiC semiconductor layer and provided with an opening for exposing therethrough the front surface of the SiC semiconductor layer;
an electrode connected to the SiC semiconductor layer through the opening of the field insulation film; and
a guard ring having a second-conductivity-type impurity and being formed in a surface layer portion of the SiC semiconductor layer to make contact with an outer edge portion of the electrode within the opening, the second-conductivity-type impurity in a surface layer portion of the guard ring making contact with the electrode having a smaller impurity concentration than the first-conductivity-type impurity;
wherein a boundary portion of the electrode overlaps with the guard ring in a plan view.

2. The device of claim 1, wherein the guard ring has a depth of 2,000 Å or more, the second-conductivity-type impurity in the surface layer portion of the guard ring extending from the front surface of the SiC semiconductor layer to a depth of 1,000 Å having a smaller impurity concentration than the first-conductivity-type impurity.

3. The device of claim 1, wherein the electrode is formed to cover a peripheral edge portion of the field insulation film around the opening.

4. The device of claim 1, wherein the electrode includes a barrier-forming electrode for forming an electric potential barrier through a junction with the SiC semiconductor layer.

5. The device of claim 4, wherein the barrier-forming electrode is made of a metal for forming a Schottky junction through the junction with the SiC semiconductor layer.

6. The device of claim 4, wherein the barrier-forming electrode is made of a polysilicon for forming hetero-junction through the junction with the SiC semiconductor layer.

7. A SiC semiconductor device, comprising:
a SiC semiconductor layer having a first-conductivity-type impurity;
a MIS transistor structure formed in the SiC semiconductor layer, the MIS transistor structure including a first-conductivity-type source region, a second-conductivity-type body region making contact with the source region, a first-conductivity-type drift region making contact with the body region and a gate electrode opposed to the body region across a gate insulation film and configured to form a channel in the body region to allow an electric current to flow between the drift region and the source region;
a guard ring having a second-conductivity-type impurity and being formed in a surface layer portion of the SiC semiconductor layer to surround the MIS transistor structure;
a field insulation film formed on a front surface of the SiC semiconductor layer and provided with an opening for exposing therethrough the source region and the guard ring; and
a source electrode connected to the source region and the guard ring through the opening of the field insulation film, the second-conductivity-type impurity in a surface layer portion of the guard ring making contact with the source electrode having a smaller impurity concentration than the first-conductivity-type impurity;
wherein a boundary portion of the source electrode overlaps with the guard ring in a plan view.

* * * * *